(12) United States Patent
Kihara et al.

(10) Patent No.: US 7,218,657 B2
(45) Date of Patent: May 15, 2007

(54) OPTICAL TRANSMITTING MODULE HAVING A CAN TYPE PACKAGE AND PROVIDING A TEMPERATURE SENSOR THEREIN

(75) Inventors: Toshiaki Kihara, Yokohama (JP); Hisao Go, Yokohama (JP); Eiji Tsumura, Yokohama (JP); Kiyoshi Kato, Yokohama (JP); Akihiro Moto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 203 days.

(21) Appl. No.: 10/901,449

(22) Filed: Jul. 29, 2004

(65) Prior Publication Data

US 2005/0047461 A1  Mar. 3, 2005

Related U.S. Application Data

(63) Continuation-in-part of application No. 10/887,328, filed on Jul. 9, 2004.

(30) Foreign Application Priority Data

| Jul. 9, 2003 | (JP) | ............................. 2003-272563 |
| Jul. 28, 2003 | (JP) | ............................. 2003-281287 |
| Jul. 30, 2003 | (JP) | ............................. 2003-283074 |

(51) Int. Cl.
*H01S 5/00* (2006.01)
(52) U.S. Cl. ............................. 372/43.01; 372/29.05; 372/54
(58) Field of Classification Search ............. 372/36, 372/43.01, 29.015, 54
See application file for complete search history.

(56) References Cited

U.S. PATENT DOCUMENTS

| 5,212,699 | A | 5/1993 | Masuko et al. |
| 6,618,408 | B1 | 9/2003 | Mader et al. |
| 6,647,039 | B2 * | 11/2003 | Fu et al. ........................ 372/36 |
| 6,868,104 | B2 * | 3/2005 | Stewart et al. ................ 372/36 |
| 2002/0018500 | A1 * | 2/2002 | Aikiyo et al. ................. 372/36 |
| 2002/0167977 | A1 | 11/2002 | Nakabayashi et al. |
| 2003/0113076 | A1 * | 6/2003 | Naka et al. .................... 385/92 |
| 2004/0028098 | A1 * | 2/2004 | Miyokawa et al. ........... 372/36 |
| 2004/0037334 | A1 * | 2/2004 | Funada et al. ................ 372/43 |
| 2004/0179562 | A1 * | 9/2004 | Carroll et al. ................ 372/36 |
| 2004/0208211 | A1 * | 10/2004 | Maruyama et al. ........ 372/38.1 |

(Continued)

FOREIGN PATENT DOCUMENTS

JP       7-240565       9/1995

(Continued)

*Primary Examiner*—Dung (Michael) T. Nguyen
(74) *Attorney, Agent, or Firm*—McDermott Will & Emery LLP (57) ABSTRACT

The present invention provides an optical transmitting module capable of outputting a signal for precisely controlling bias and modulation current, and a transmitting optical sub-assembly using the same. The optical transmitting module of the invention builds a semiconductor laser diode 5 and a temperature sensor within a CAN type package. The CAN type package includes a base, a block provided on the base and mounting the laser diode on a side thereof, and a plurality of leads secured to the base. The laser diode is supplied current signal $S_{DRV}$ through one of leads, while the temperature sensor outputs a signal $S_{TEMP}$ through the other of leads. The temperature sensor is mounted immediately close to the laser diode, accordingly, capable of monitoring the temperature of the laser diode.

9 Claims, 12 Drawing Sheets

U.S. PATENT DOCUMENTS

2004/0247004 A1* 12/2004 Keh et al. .................. 372/36
2005/0013561 A1* 1/2005 Kuhara et al. ............... 385/92

FOREIGN PATENT DOCUMENTS

| JP | 2000-28872 | 1/2000 |
| JP | 2000-353846 | 12/2000 |
| JP | 2002-374028 | 12/2002 |
| JP | 2003-37329 | 2/2003 |
| JP | 2003-229629 | 8/2003 |
| JP | 2003-332667 | 11/2003 |

* cited by examiner

OPTICAL TRANSMITTING MODULE HAVING A CAN TYPE PACKAGE AND PROVIDING A TEMPERATURE SENSOR THEREIN

CROSS REFERENCE TO RELATED APPLICATIONS

This application is a continuation-in-part of and claims priority to U.S. patent application Ser. No. 10/887,328, filed on Jul. 9, 2004, entitled "Optical transmitting module" by Go, Hisao et al., which claims the benefit of Japanese Patent Application No. JP 2003-272653, filed on Jun. 9, 2003, and also is a continuation-in-part of and claims priority to U.S. patent application Ser. No. 10/900,397 filed on Jul. 28, 2004, entitled Optical transmitting module having a de-coupling inductor therein." By Kato Kiyoshi, et al. which claims the benefit of Japanese Patent Application No. JP 2003-281287, filed on Jul. 28, 2003. In addition priority is claimed from Japanese Patent Application No. JP 2003-283074, filed on Jul. 30, 2003, the entire disclosure of which is incorporated by reference, herein.

BACKGROUND OF THE INVENTION

1. Field of the Invention

The present invention relates to an optical transmitting module, particularly to an optical transmitting module having a CAN type package.

2. Related Prior Art

Recent optical communication system inevitably uses a semiconductor laser diode as an optical signal source because of its compactness and low power consumption. To drive the laser diode, bias and modulation currents must be adequately applied thereto depending on characteristics of the laser diode such as a threshold current and a slope-efficiency. These characteristics have large temperature dependence.

Moreover, recent optical communication system requests a high transmission speed over giga-bit rate, reaching 10 Gbit/sec. In order to realize such high transmission speed with a predetermined extinction ratio, enough current must be supplied to the laser diode, which results on an increasing of the power consumption, and accordingly needs a precise control of the current depending on the temperature of the laser diode Therefore, a temperature sensor for sensing the temperature of the laser diode is necessary and installed within the package. In an optical transmitting module having, what is called, a butterfly type package, it is rather easy to build a thermoelectric device, typically a Peltier device, within the package because the butterfly type package has an enough space. By using the Peltier device, the temperature of the laser diode can be kept substantially constant. That is, a temperature sensor, such as thermistor, is installed immediate side of the laser diode on the Peltier device, and the temperature of the Peltier device can be controlled by a signal output from this thermistor.

On the other hand, in an optical transmitting module having, what we call, a CAN type package, it is quite hard to build the temperature sensor within the package because of its compact size. For example, an external diameter of the CAN type package is typically from 3.8 mm to 5.6 mm at most. The laser diode in the CAN type package is usually used without any temperature compensation.

Therefore, one object of the present invention is to provide an optical transmitting module capable of outputting a signal for controlling bias and modulation currents for the laser diode as varying the temperature thereof.

SUMMARY OF THE INVENTION

One aspect of the present invention is to provide an optical transmitting module that comprises a semiconductor laser diode, a temperature sensor and a CAN type package. The CAN type package encloses the laser diode and the temperature sensor therein, and includes a base and a block provided on the base. The block has a side surface on which the laser diode is mounted.

The temperature sensor may be mounted on the block. More specifically, the temperature sensor may be mounted on the same side surface as the laser diode is mounted, another side surface opposite to the side surface where the laser diode is mounted thereon, or a top surface of the block. In another configuration, the temperature sensor may be mounted on the base, or on a lead secured to the base. The lead may include a flat side surface on a top end portion thereof, and the temperature sensor may be mounted on the flat side surface of the lead.

The optical module may further include another lead and an inductor. The other lead may include a flat side surface on a top end portion thereof, and the inductor may be mounted on the side surface of the other lead.

The optical module my further include a driver for driving the laser diode. The driver may be mounted on the side surface of the block on which the laser diode is also mounted. The driver may be a transistor, more specifically, may be a bipolar transistor or a field effect transistor both having two current terminals and one control terminal. The driver may be an integrated circuit in which a driving circuit and a temperature sensor may be built.

Another aspect of the present invention is to provide a transmitting optical subassembly that comprises an optical transmitting module, a welding member, an alignment member and a sleeve assembly. The optical transmitting module include a laser diode, a temperature sensor and a CAN type package having a base, a block and a cap. The base and the cap form a cavity into which the laser diode and the temperature sensor are enclosed. The welding member cylindrically surrounds the cap. The alignment member has a bore into which the welding member is inserted and fixed. The sleeve assembly includes a stub a coupling fiber being disposed in a center thereof, a sleeve, a sleeve cover, and a bush. The sleeve holds the stub in an end portion thereof. The bush is press-fitted between the sleeve cover and the end portion of the sleeve such that the stub is tightly positioned within the sleeve. The sleeve assembly is optically aligned to the CAN type package by sliding the sleeve assembly on an end surface of the alignment member and by sliding the welding member within the bore of the alignment member.

The temperature sensor in the CAN type package may be mounted on the side surface of the block where the laser diode is also mounted thereon. The optical transmitting module of the transmitting optical sub-assembly may further include a lead secured to the base and an inductor mounted on the lead. Further, the optical transmitting module may include a driver for driving the laser diode on the same side surface as the laser diode is mounted.

DETAILED DESCRIPTION OF PREFERRED EMBODIMENTS

Next, preferred embodiments of the invention will be described in detail as referring to accompanying drawings. In specifications below and drawings, same elements will be referred by same numerals or same symbols without over lapping explanations.

(First Embodiment)

Figure 1:
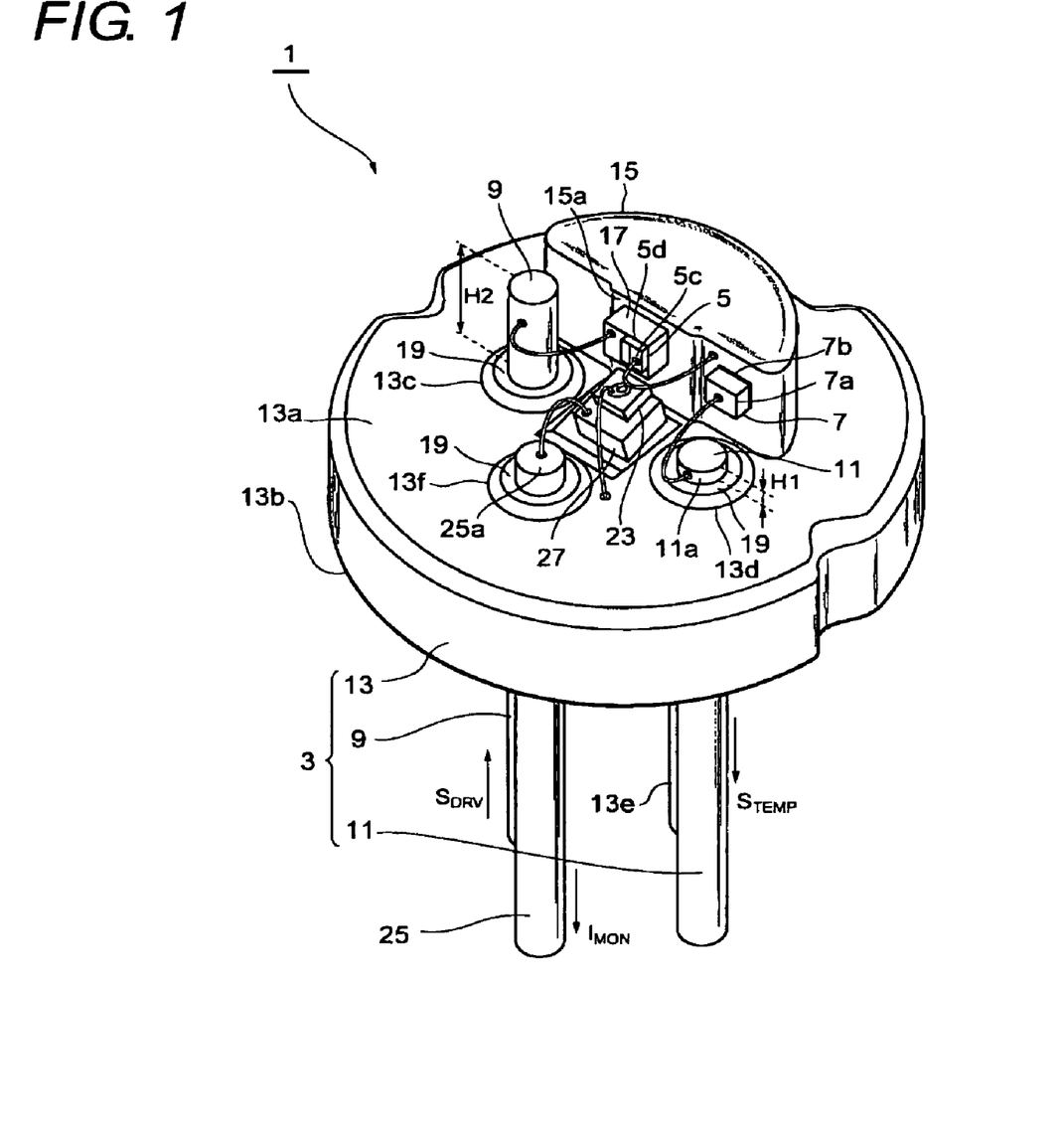
FIG. 1 is a perspective view showing an optical transmitting module according to the first embodiment of the invention.
Figure 2:
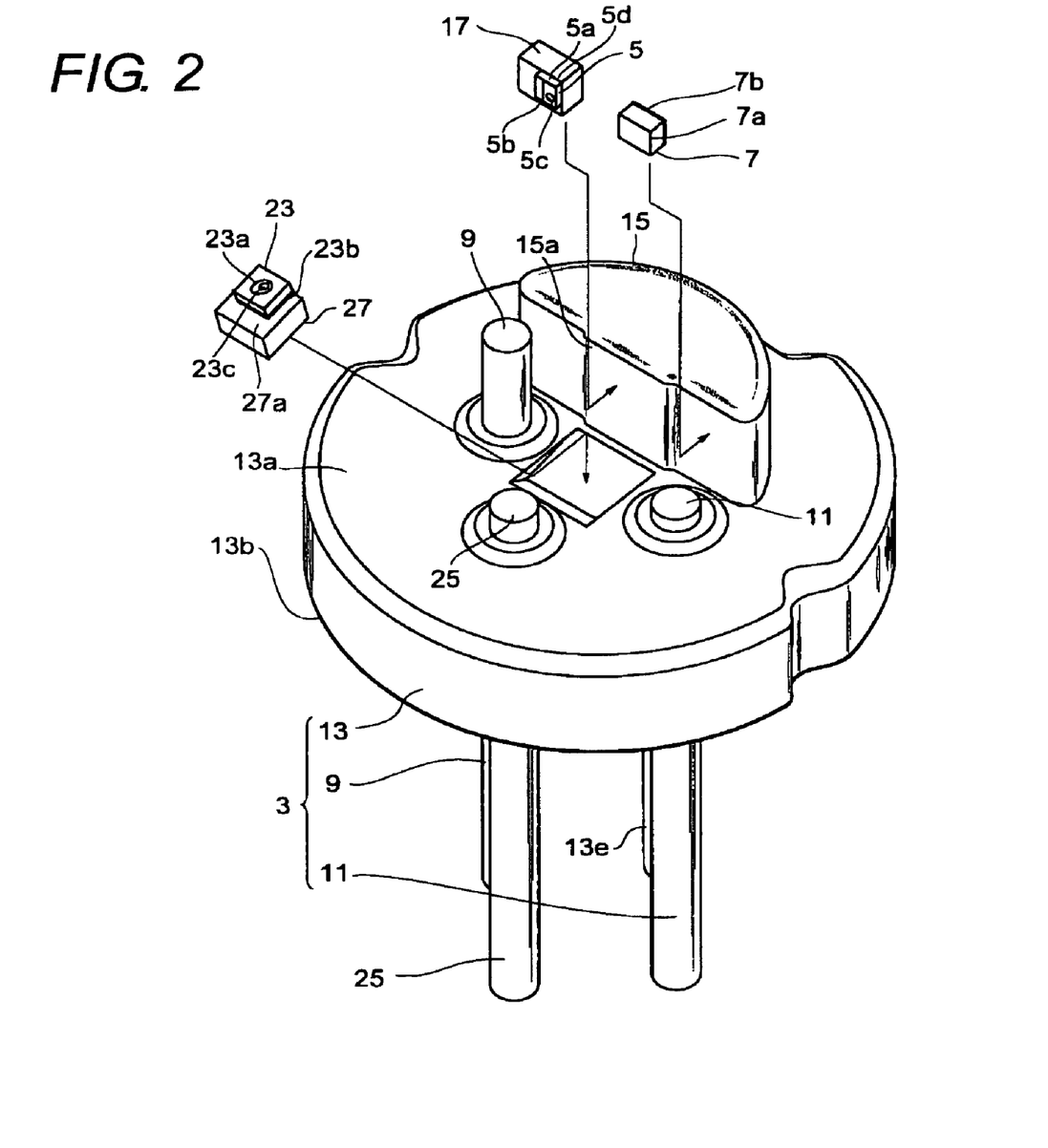
FIG. 2 is an exploded view of the optical transmitting module of the first embodiment.

FIG. 1 shows an optical transmitting module 1 according to the first embodiment of the present invention, and FIG. 2 is an exploded view of the optical transmitting module 1.

The optical transmitting module 1 includes a stem 3, a semiconductor laser diode 5, and a temperature sensor 7, which is hereinafter denoted by the T-sensor. The stem 3 provides a disk-shaped base 13, a plurality of leads 9, 11 and 25, and a block 15. Thus, these elements form a CAN type package.

The block 15 includes a side surface 15a, on which the laser diode 5 and the T-sensor 7 are mounted side by side. This arrangement of the laser diode and the temperature sensor enables that the T-sensor senses heat generated by the laser diode 5 without being influenced by external disturbance. The laser diode 5 receives a driving signal $S_{DRV}$ via the lead 9, while the T-sensor generates a sensing signal $S_{TEMP}$ and outputs the signal $S_{TEMP}$ through another lead 11.

In the present embodiment, the optical transmitting module 1 does not include any thermoelectric cooler within the package. The signal $S_{TEMP}$ is utilized to adjust the bias current and the modulation current; they are supplied to the laser diode from the outside of the package. The T-sensor may be typically a thermistor. However, another type of devices, such as a resistor having a linear temperature co-efficient or a forward biased diode, may be applicable for the T-sensor.

The laser diode 5, having a front facet 5a and a rear facet 5b, is mounted on the side surface 15a of the block 15 via a heat sink 17. The heat sink 17, made of insulating material with good thermal conductivity, typically aluminum nitride (AlN), provides metallic pattern made of AuSn eutectic alloy on both surfaces thereof for the brazing. The metallic pattern on the primary surface of the heat sink 17 is provided for the die-bonding of the laser diode 5 and for the wire-bonding thereto, while the metallic pattern on the other surface is for the chip mounting of the heat sink 17 onto the block 15. The heat sink is not restricted to the insulating material. An electrically conductive material, such as copper tungsten (CuW) sintered metal, may be applicable for the heat sink 17. When the electrically conductive heat sink 17 is used, the laser diode 5 is directly connected to the block 15, i.e., to the base 13.

The base 13 and the block 15 are made of metal such as Kovar. The diameter of the base is about 3.8 mm, and in the present invention, the T-sensor 7 is built in the CAN type package having such small diameter. The base 13 includes a plurality of holes 13c and 13d, through which the leads 9 and 11 pass. Within the holes 13c and 13d are filled with seal glass 19. The base 13 supports the leads 9 and 11 via the seal glass 19. Moreover, the base 13 directly, i.e., without any seal glass, secures the lead 13e. Accordingly, the base 13 and the block 15 are electrically connected to the lead 13e.

The laser diode 5 includes a first electrode 5c and a second electrode 5d. The first electrode is connected to the surface 15a of the block 15 with a bonding-wire, while the second electrode 5d is connected to the lead 9 via the metallic pattern provided on the heat sink 17 and the bonding-wire.

The T-sensor 7 includes a first terminal 7a and a second terminal 7b. The first terminal 7a is connected to the lead 11 with a bonding-wire, while the second terminal 7b faces and is fixed to the block 15 with conductive resin. A protruding length H1 of the lead 11, which is equivalent to a level of the tip of the lead 11, is smaller than that H2 of the lead 9. The bonding-wire connecting the lead 11 and the T-sensor is bonded to the side 11a of the lead 11.

The transmitting module 1 may further include a light-receiving device 23, such as photodiode, on the base 13 for monitoring optical output power of the laser diode 5. The photodiode 23 generates photo current $I_{MON}$ corresponding to the optical output power of the laser diode 5. One electrode 23b of the photodiode 23 is connected to another lead 25 to output the photo current $I_{MON}$ therefrom. The photodiode 23 is mounted on a sub-mount 27 having a wiring pattern, and the sub-mount 27 is placed on the base 13. The other electrode 23a of the photodiode 23 is directly connected to the base 11 with a bonding-wire. The electrode 23b of the photodiode 23 is connected to the lead 25 via the wiring pattern on the heat sink 27 and a bonding-wire.

An arrangement of the laser diode 5, the T-sensor 7, the photo diode 23 and respective leads 9, 11 and 25 enables that the wire-bonding between these devices and elements can be performed without interfering any of other wire-bonding. That is, the bonding-wire connecting the laser diode 5 to the lead 9, that connecting the laser diode 5 to the block, that connecting the T-sensor to the lead 11 each extend to different directions. Moreover, the bonding-wire connecting the photodiode 23 to the lead 19 and that connecting the photodiode to the base 13 extend to the different direction to the former bonding-wires around the laser diode 5, thus not interfering with each other.

As shown in FIG. 1 and FIG. 2, the side surface 15a of the block 15 provides a mesa portion in a center thereof, on which the laser diode 5 is mounted, while The T-sensor 7 is mounted on one of depressed portion. Thus configured side surface 15a of the block 15 enables that, by positioning the leads 9 and 11 to the depressed portions of the side surface 15a, the leads 9 and 11, the laser diode, and the photodiode 23 are arranged substantially in a line. Moreover, the laser diode 5 is mounted on an upper portion of the side 15a, while the T-sensor is mounted on a middle portion thereof. Accordingly, the bonding-wire connecting the laser diode 5 to the side surface 15a may be bonded to the upper portion of the side 15a, i.e., above the T-sensor. It is unnecessary to widen the side 15a of the block in order to secure a bonding area.

The level of the lower edge of the laser diode 5 is higher than a maximum level of the bonding-wire connecting the T-sensor 7 to the lead 11. An enough space is secured below the laser diode 5 to facilitate the wire-bonding from the T-sensor to the side surface 11a of the lead 11. Moreover, the T-sensor is mounted on the depressed portion of the side 15a of the block, whereby the photodiode does not influence the wire-bonding from the T-sensor 7 to the side 11a of the lead 11. The bonding-wire connecting the photodiode 23 to the lead 25 and that connecting to the base 13 do not interfere with the wire-bonding to the T-sensor 7.

Figure 3:
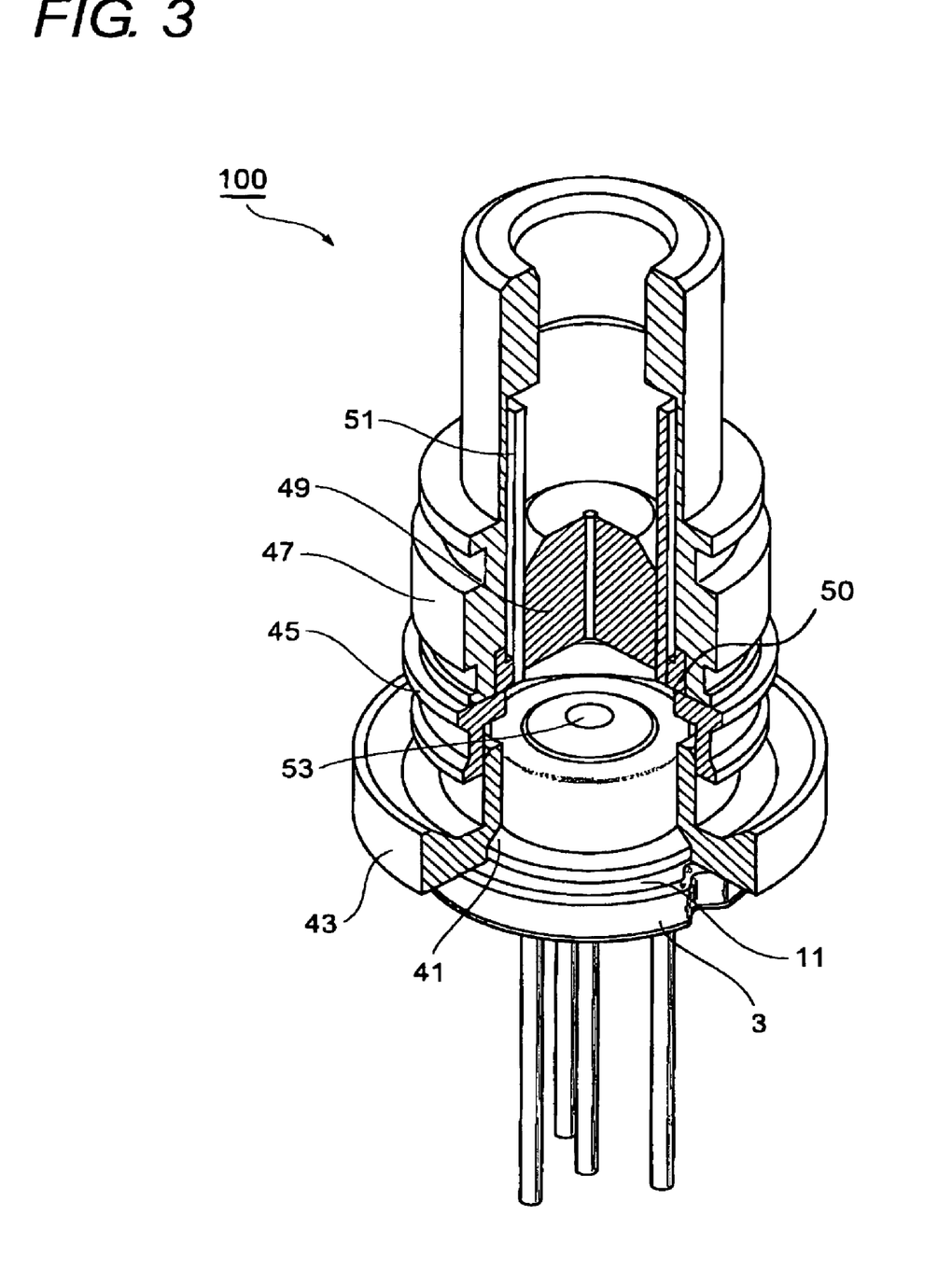
FIG. 3 is a cutaway view of a transmitting optical sub-assembly using the optical transmitting module of the present invention.

FIG. 3 shows a transmitting optical sub-assembly (TOSA) 100 including the optical transmitting module 1 described above. The TOSA 100 includes a cap 41 for enclosing optical and electrical devices therein cooperating with the stem 3, a welding member 43, an alignment member 45, and a sleeve assembly. The sleeve assembly includes a sleeve cover 47, a stub 49, a bush 50, and a split sleeve 51.

The cap 41 may provide a lens 53 on a top center thereof for converging light emitted from the laser diode 5 to a coupling fiber provided in a center of the stub 49. The lens 53 may be fixed to the cap 41 with a low-melting glass so as to seal air-tightly the laser diode 5 and the T-sensor 7. The welding member 43 is provided for the YAG-laser welding to the alignment member 45. That is, after optical alignment between the alignment member 45 and the welding member 43 along the optical axis by sliding the alignment member 45 on the outer surface of the welding member 43, the YAG-laser welding is carried out for permanently fixing these two members.

The split sleeve 51 secures the stub 49 in one end thereof, and a metallic bush 50 is press-fitted between the split sleeve 51 and the sleeve cover 47. The stub 49 is secured in the end of the split sleeve 51. Thus configured sleeve assembly is optically aligned to the laser diode 5 by sliding the sleeve assembly on the end surface of the alignment member 45, which aligns to each other in a plane perpendicular the optical axis.

In the TOSA 100 shown in FIG. 3, the T-sensor 7 can be installed within the CAN type package without expanding the diameter of the base as foregoing description. Consequently, the diameter of the cap 41 is unnecessary to expand. Moreover, since the T-sensor is built in the CAN type package, the temperature of the laser diode 5 can be precisely measured without being influenced from the ambient convection.

A window substantially transparent to the light emitted from the laser diode may be replaced to the lens 53. In this case, a lens for converging light from the laser diode to the coupling fiber in the stub may be disposed outside of the cap 41.

(Second Embodiment)

Figure 4:
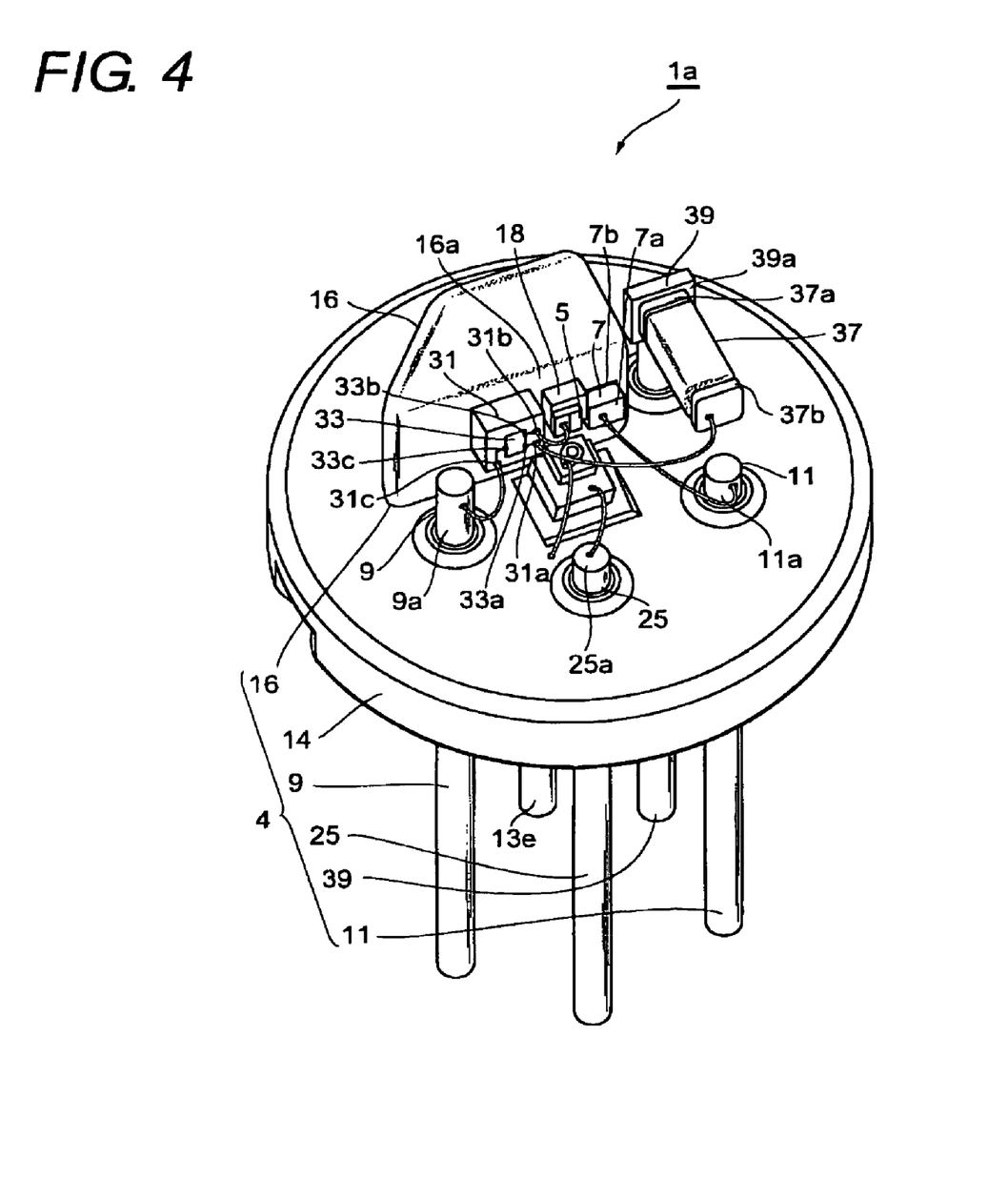
FIG. 4 is a perspective view showing an optical transmitting module according to the second embodiment of the invention.

FIG. 4 shows a modified optical transmitting module 1a according to the second embodiment of the present invention.

In the optical module 1a shown in FIG. 4, a driver 31 for driving the laser diode 5 is mounted on the side surface 16a of the block 16 in addition to the laser diode 5 and the T-sensor 7. The driver 31 may be a transistor 33 having two current electrodes 33a and 33b, and one control electrode 33c. One of current electrodes 33b is connected to the laser diode 5 via the terminal 31b and the other of current electrodes 33a is connected to the inductor 37, while the control electrode 33c is connected to the lead 9 via the terminal 31c. The transistor 33 may be a bipolar transistor or a field effect transistor. Thus, the driver 33 receives a driving signal from the lead 9, a bias signal from the inductor 37, and outputs a superimposed signal of the driving signal on the bias signal to the laser diode 5.

The driver 31 may be an integrated circuit (IC) replaced to the transistor. The IC may include not only a circuit for driving the laser diode but also a temperature sensor utilizing a resistor or a p-n junction formed integrally within the IC. The temperature sensor in the IC outputs a signal corresponding to the temperature of the IC. The IC supplies the bias current and the modulation current to the laser diode 5.

The optical module 1a further includes an inductor 37 provided on the lead 39, which has a flat side 39a in a top thereof for mounting the inductor 37 thereon. The inductor 37 may be a chip inductor or a ferrite bead inductor. The first terminal 37a of the inductor 37 is fixed to the side surface 39a of the lead 39, while the second terminal 37b is connected to the terminal 31a of the driver 31 with a bonding-wire. Thus, the bias signal to the laser diode 5 is supplied through the lead 39, the inductor 37, and the driver 31. The side surface 39a of the lead 39 can be formed by the stamping or the machining.

Since the present optical module 1a installs the inductor 37 on the lead 39, the block 16 is not necessary to secure the space for installing the inductor 37. The inductance of the inductor 37 may be greater than 1 micro-henry (uH) for de-coupling the bias circuit from the signal line.

The side surface 39a of the lead and the side surface 16a of the block have parallel and uneven relation to each other. The inductor is provided on the surface 39a such that one terminal thereof 37a faces and is fixed to the surface 39a, whereby the surface of other terminal 37b of the inductor 37 becomes parallel to both surfaces 39a and 16a. Accordingly, the laser diode 5 and the driver 31, both are mounted on the side surface 16a, and the terminal 37b of the inductor can be wire-bonded to each other.

In the optical module 1a, the lead 9, the driver 31, the laser diode 5, the T-sensor and the lead 39 are arranged in this order on the base 14. The other lead 11 locates off from the lead 39 and the T-sensor between them. This configuration of devices and elements enables those wire-bonding from the T-sensor 7 to the lead 11, from the lead 9 to the terminal 31c of the driver 31, from another terminal 31b to the laser diode 5, and from the terminal 31a to the inductor 37. These bonding-wires do not interfere with any one of another bonding-wire.

(Third Embodiment)

Figure 5:
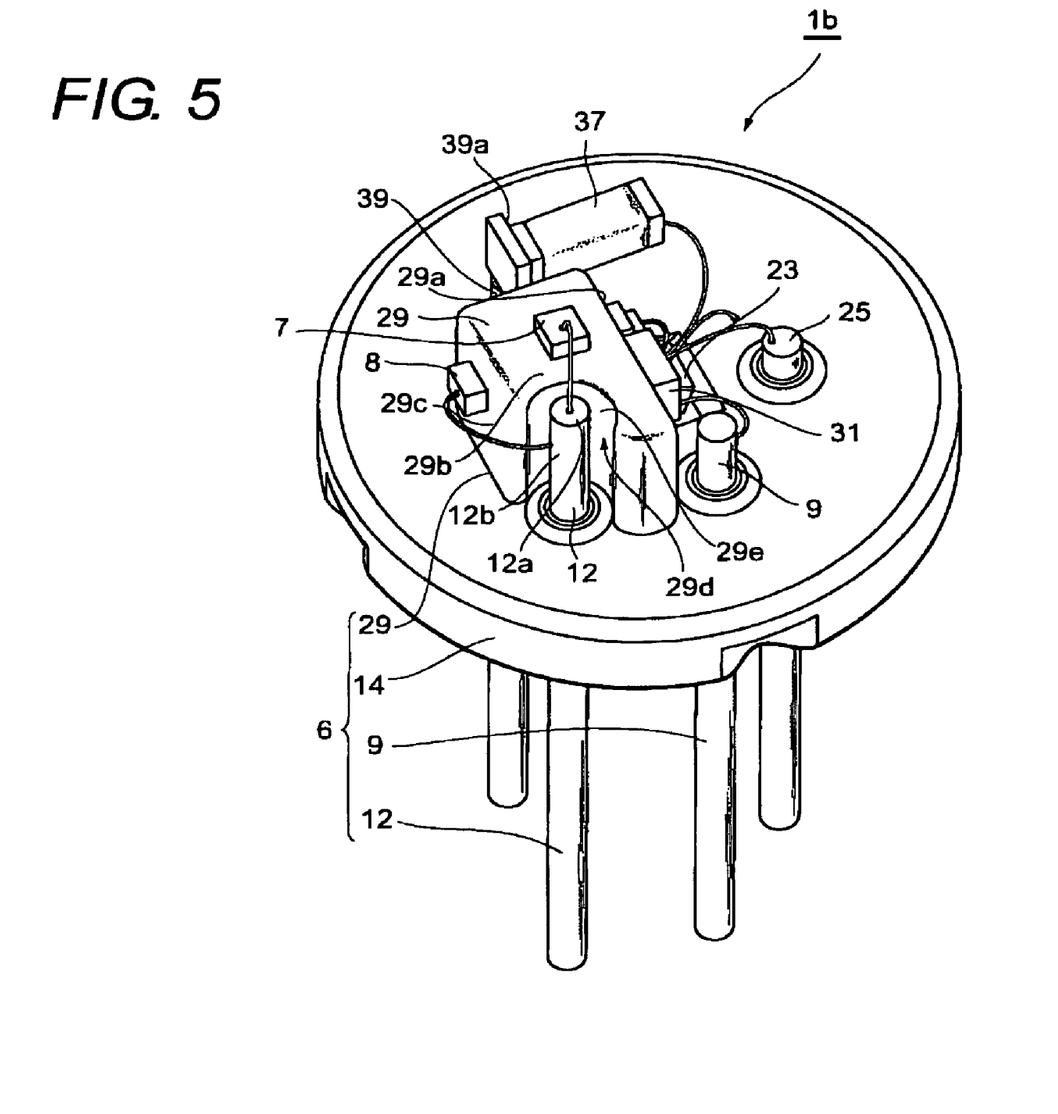
FIG. 5 is a perspective view showing an optical transmitting module according to the third embodiment of the invention.

FIG. 5 is a perspective view of an optical module 1b according to still another embodiment of the invention.

In this optical module shown in FIG. 5, two T-sensors 7 and 8 are disposed on the side surface 19c and the top surface 29b of the block 29, respectively. The side 29c is opposite to the surface 29a where the laser diode and the driver 31 are mounted thereon. Both the T-sensors 7 and 8 are connected to the lead 12 with bonding-wires. These wires do not interfere with any of other bonding-wires between the laser diode 5, the driver 31 and the inductor, because not only the lead 12 is apart from the other lead and the primary side 29a of the block 29, but also the block 29 is interposed between the lead 12 and other devices and elements. The block 29 includes a hollow portion 29d for positioning the lead 12. The laser diode 5 should be placed on the base 14 such that the optical axis thereof positions substantially in the center of the base 14. In the arrangement of the present embodiment, since the T-sensors 7 and 8 are fixed to surfaces 29b and 29c of the block 29 different to the surface 29a and the lead 12 is positioned behind the surface 29a, a small-sized base can be realized. A diameter of the base 14 shown in FIG. 5 can be suppressed to about 5.6 mm.

(Fourth Embodiment)

Figure 6:
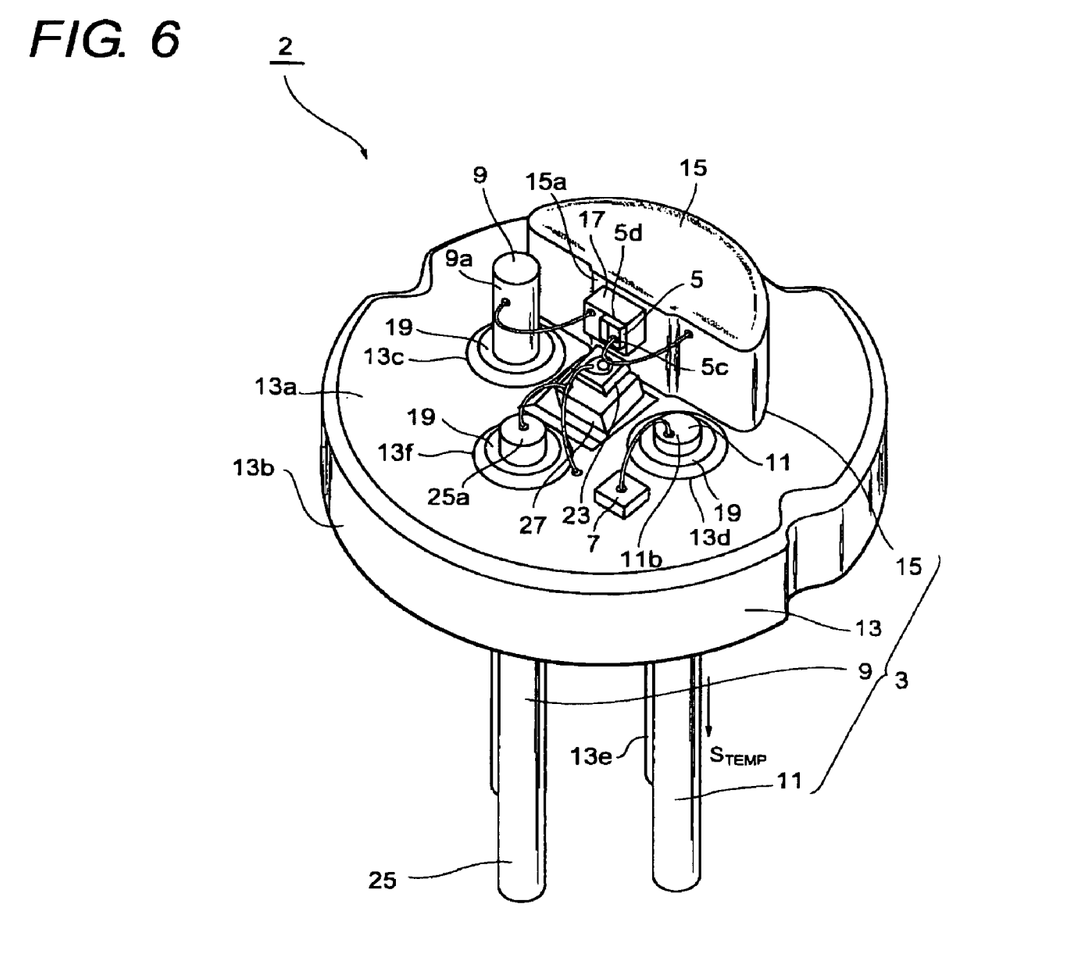
FIG. 6 is a perspective view showing an optical transmitting module according to the fourth embodiment of the invention.

FIG. 6 shows an optical transmitting module 2 according to the fourth embodiment of the invention.

In the present embodiment, the T-sensor 7 is placed on the base 13. Heat generated by the laser diode 5 is transferred to the T-sensor 7 through the block 15 and the base 13. The optical module 2 also, same as optical modules previously described, does not build a thermoelectric device in the stem 3. The signal $S_{TEMP}$ generated by the T-sensor 7 and output from the lead 11 should be used for the adjustment of the bias and the modulation currents supplied to the laser diode 5.

The primary surface of the T-sensor 7 and the top surface 11b of the lead 11 are substantially parallel to each other and to the primary surface 13a of the base. Therefore, the wire-bonding from the T-sensor 7 to the lead may be performed without difficulty. Moreover, the level of the lead 11, i.e., a length of the lead 11 extruding from the primary surface 13a, is lower than that of the lead 9, which enables that the bonding-wire connecting the lead 11 to the T-sensor 7 do not interfere with other bonding-wires.

(Fifth Embodiment)

Figure 7:
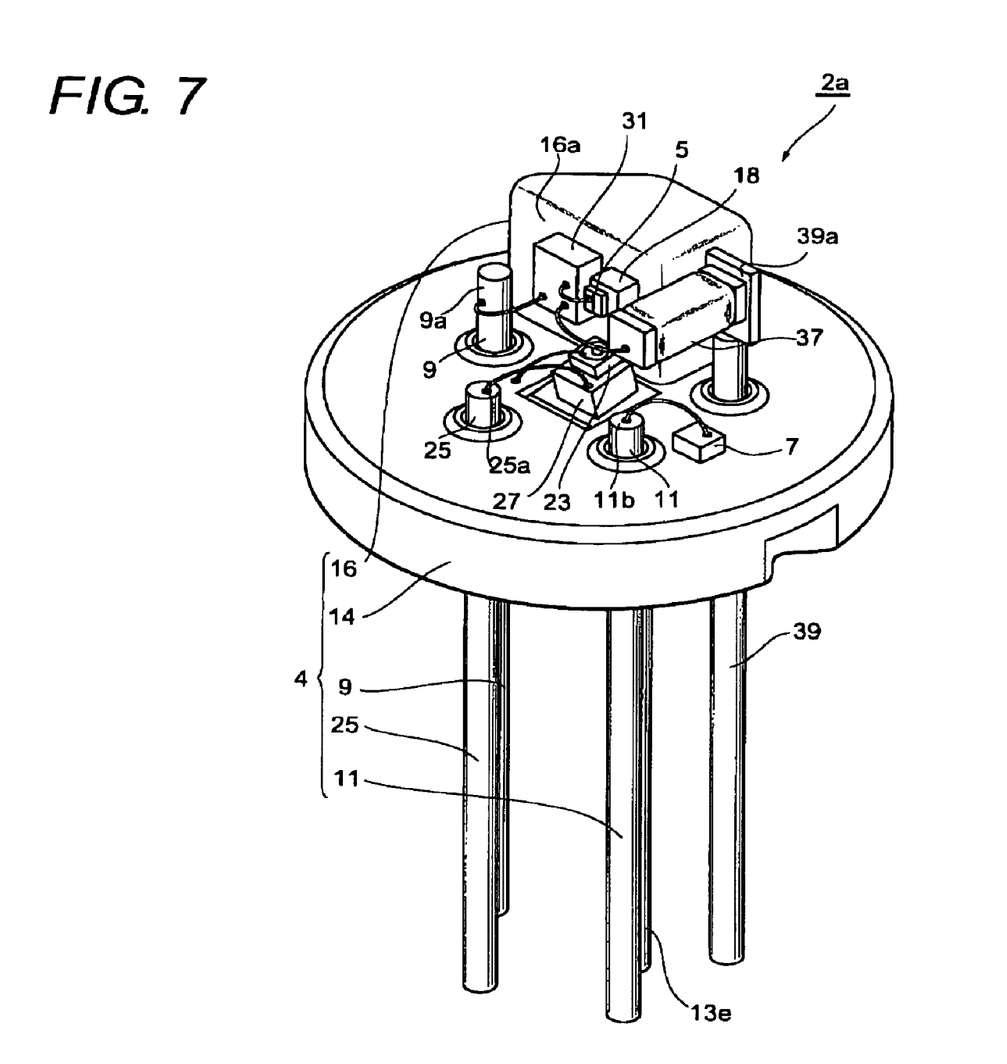
FIG. 7 is a perspective view showing an optical transmitting module according to the fifth embodiment of the invention.

FIG. 7 shows another optical module 2a according to the present invention. The optical module 2a includes, in addition to the T-sensor 7 disposed on the base 14, an inductor 37 provided on the lead 39 and a driver 31 provided on the side 16a of the block 16. The T-sensor 7 locates between leads 11 and 39 but off from the position just beneath the inductor 7. The lower limit of the inductor 37 is higher than the bonding-wire connecting the T-sensor 7 to the lead 11, because the level of the lead 39 is greater than that of the lead 11. Moreover, the lead 11 is apart from the lead 39 in order that the inductor 37 does not overlap the lead 11. Thus, even after the inductor 37 is mounted on the side 39a of the lead 39, the wire-bonding from the T-sensor 7 to the lead 11 can be carried out.

(Sixth Embodiment)

Figure 8:
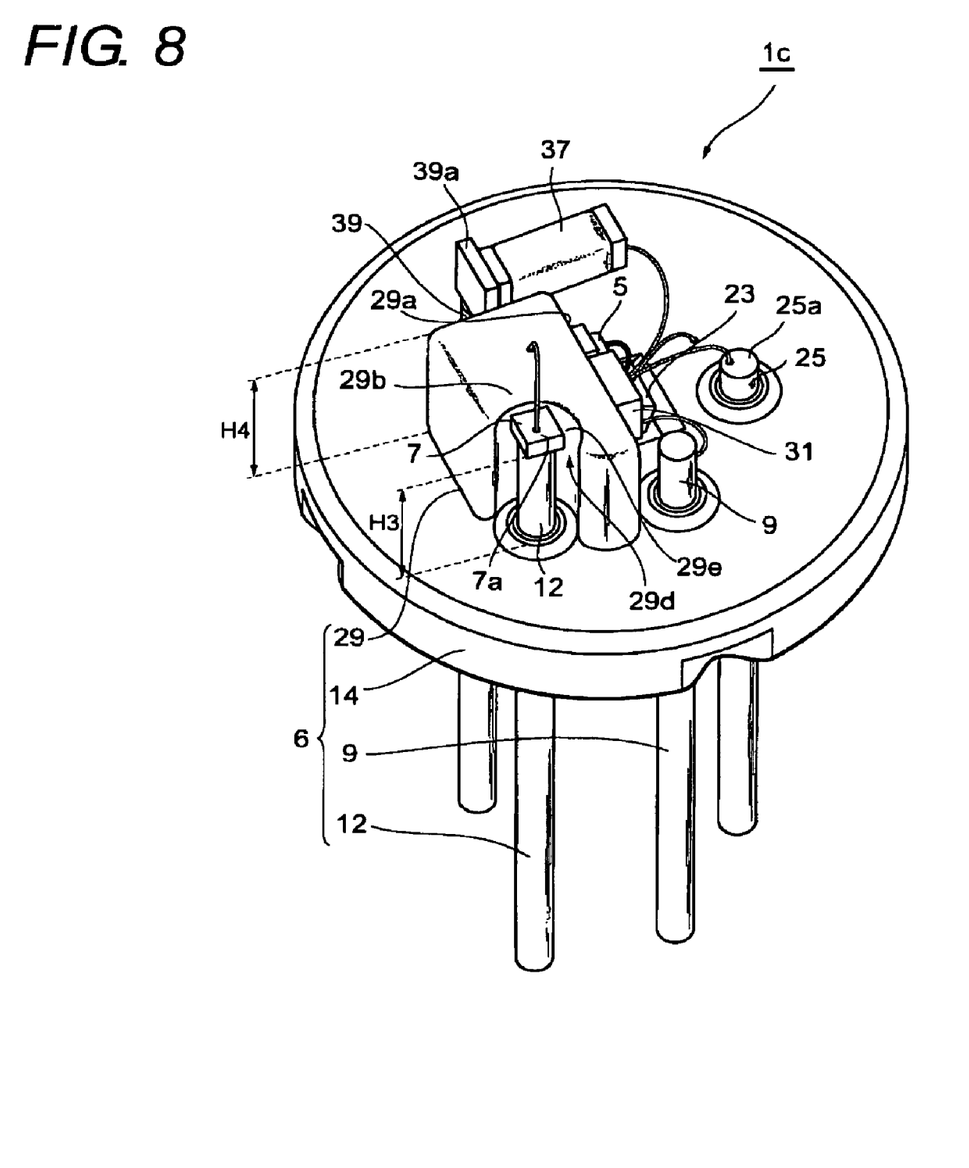
FIG. 8 is a perspective view showing an optical transmitting module according to the sixth embodiment of the invention.

FIG. 8 shows still another optical module 1c of the present invention. In this embodiment, the T-sensor 7 is mounted on the top of the lead 12. One terminal 7a of the T-sensor 7 is connected to the upper surface 29b of the block 29 with a bonding-wire, while the other terminal thereof faces and is fixed to the top of the lead 12.

Figure 9:
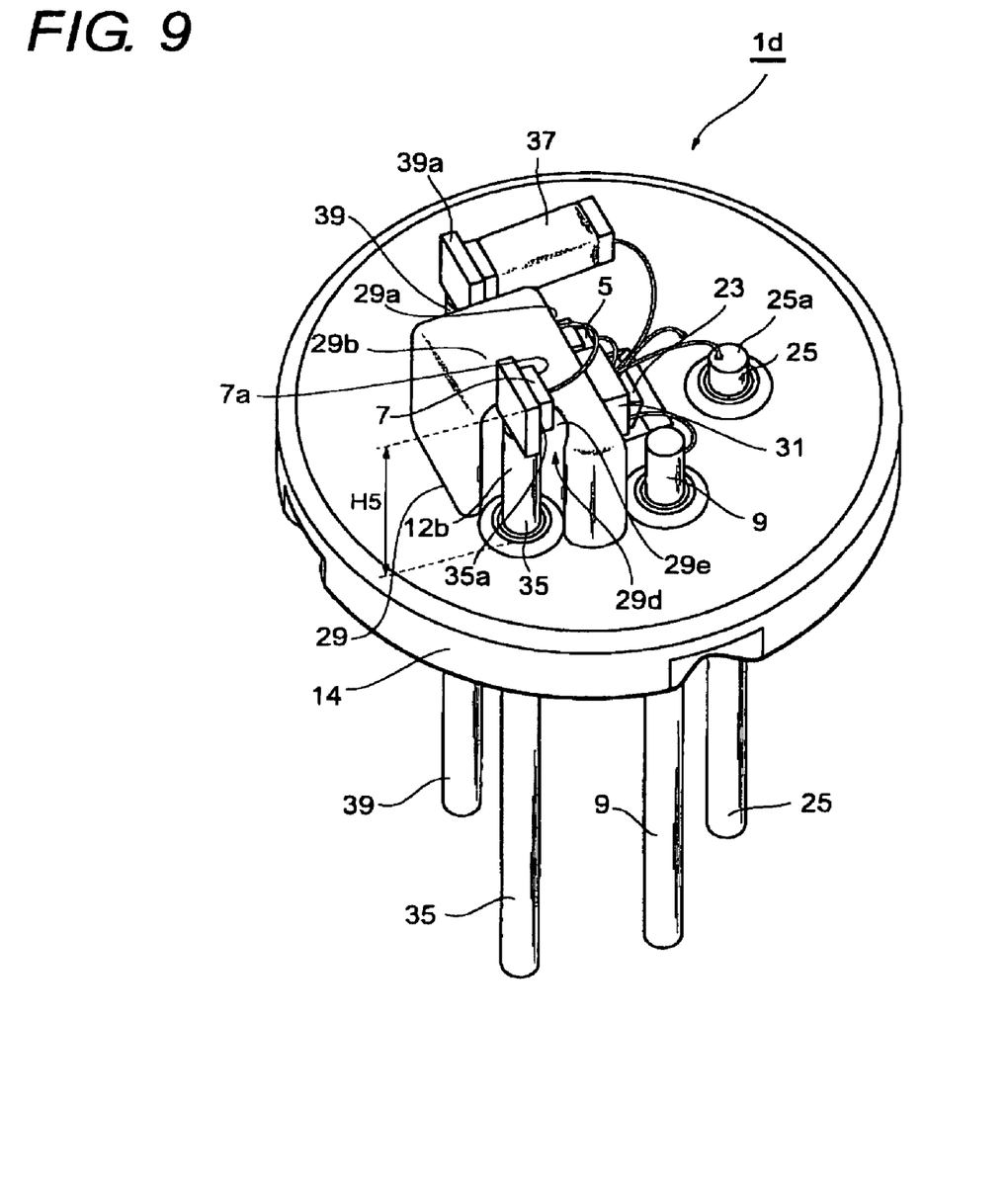
FIG. 9 is a perspective view showing a modified configuration of the optical transmitting module according to the sixth embodiment.

FIG. 9 shows another optical transmitting module 1d modified from the former embodiment shown in FIG. 8. The optical module 1d provides, replacing to the lead 12 in FIG. 8, another lead 35 that has a side surface 35a on a top portion thereof. The T-sensor 7 is mounted on the side surface 35a such that one terminal 7a of the T-sensor 7 is connected to the side 29a of the block 29, while the other terminal faces and is fixed to the side 35a.

In the former embodiment in FIG. 8, since the T-sensor 7 is mounted on the top of the lead 12, the level H3 of the lead 12 is preferably equal to or slight greater than a height H4 of the block 29. On the other hand in the present arrangement in FIG. 9, the level H5 of the lead 35 is preferably enough large in order to mount the T-sensor 7 on the side surface 35a thereof, which may enlarge a size of the module. However, heat generated by the laser diode 5 is transferred to the T-sensor 7 via the block 29 and the bonding-wire in the present optical module shown in FIG. 9. On the other hand, the former arrangement shown in FIG. 8, since the T-sensor 7 is wire-bonded to the block 29 but to the top surface 29b thereof, heat generated by the laser diode 5 is transferred to the T-sensor 7 via the side surface 29a, the top surface 29b and the bonding-wire, which lowers the thermal transfer efficiency.

(Seventh Embodiment)

From FIG. 10 to FIG. 13 show manufacturing procedure of the optical transmitting module 1, shown in FIG. 1, according to the present invention.

Figure 10:
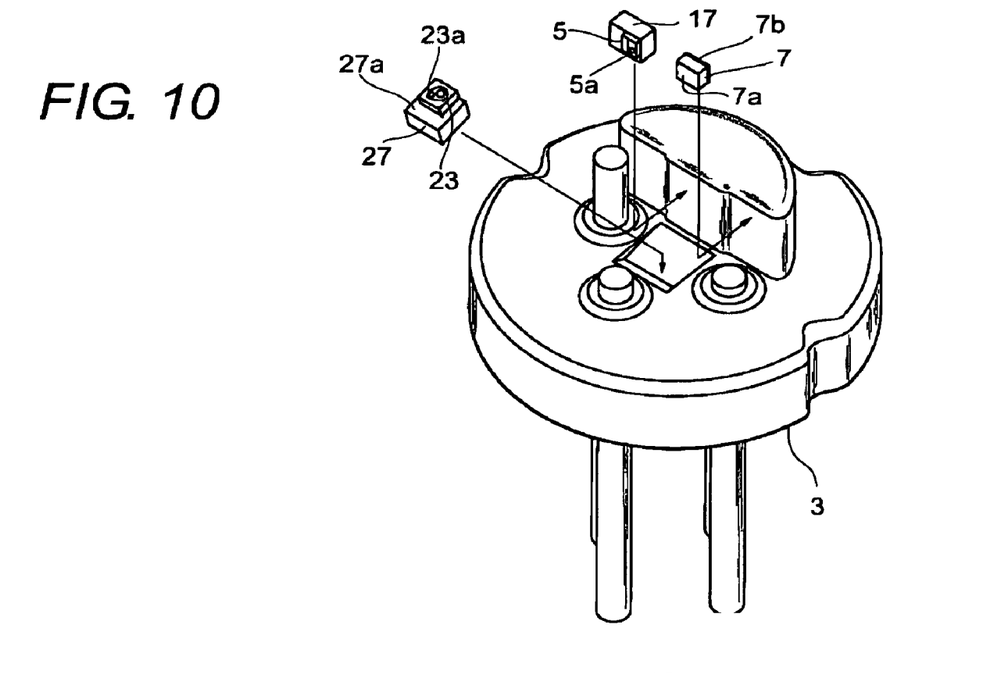
FIG. 10 shows a first manufacturing step of an optical transmitting module of the present invention.
Figure 11:
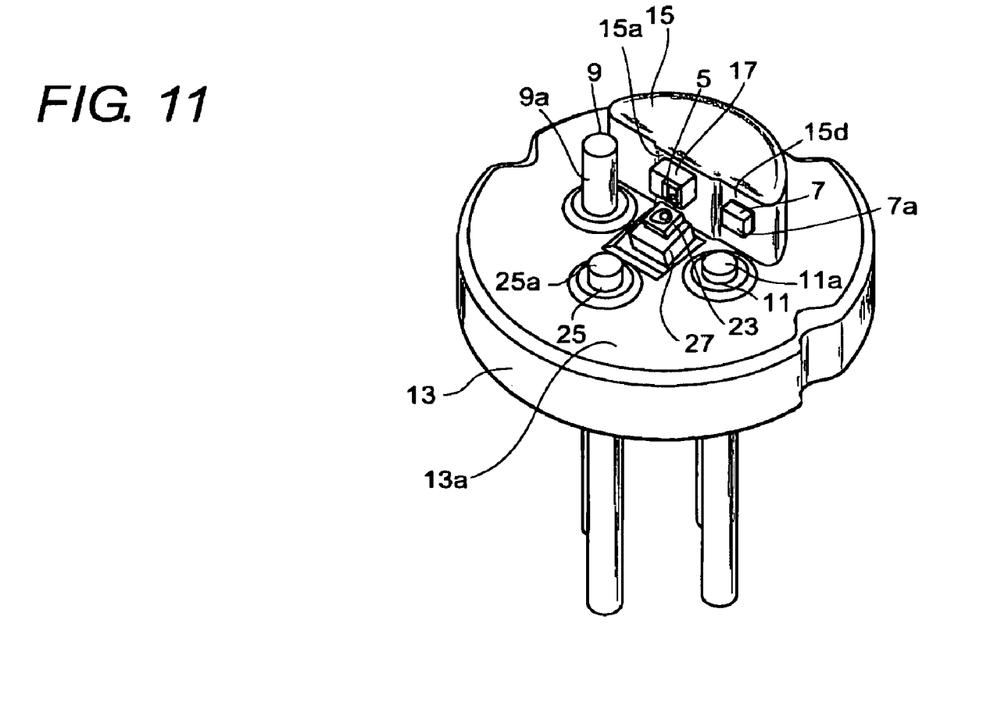
FIG. 11 shows a second manufacturing step of the optical transmitting module.

First, as shown in FIG. 10 and FIG. 11, optical and electrical devices, such as the base 3, the laser diode 5, the T-sensor 7, and the photodiode 23 are prepared. The photodiode 23 is mounted on the base 3 via the sub-mount 27, the laser diode 5 is mounted on the side surface 15a of the block 15 via the heat sink 17, and the T-sensor 7 is also mounted on the side 16a of the block 15. The heat sink 17 provides a metallic pattern on the surface thereof, and one electrode of the laser diode 5 faces and is fixed to the metallic pattern on the heat sink 17.

Figure 12:
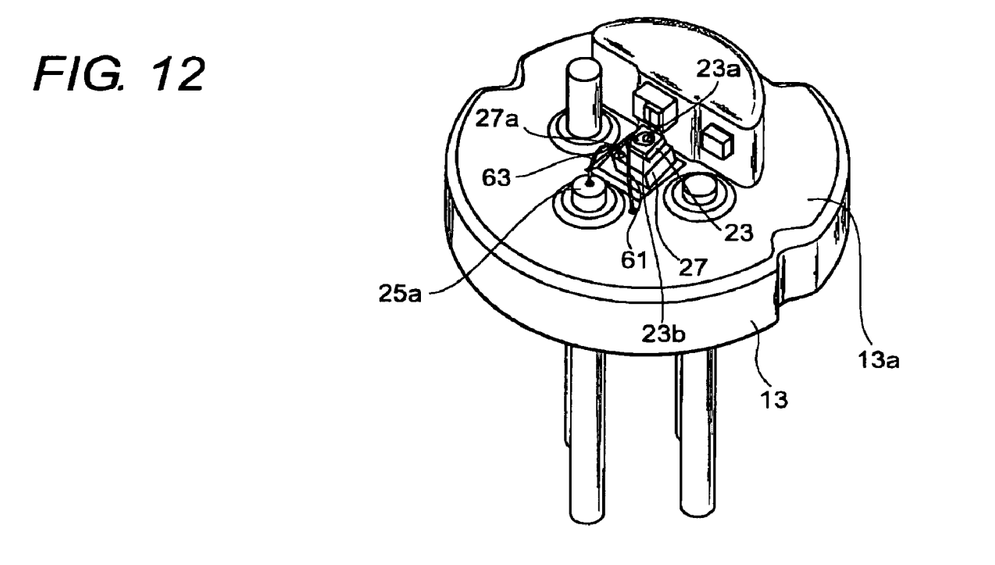
FIG. 12 shows a first wire-bonding step of the optical transmitting module carried out subsequent to FIG. 12.

Next, the first wire-bonding process is carried out as shown in FIG. 12. That is, one electrode 23a of the photodiode 23 is wire-bonded to the base 13 with a bonding-wire 61. The other electrode 23b of the photodiode 23, which faces and is fixed to a metallic pattern provided on the sub-mount 27, is wire-bonded to the top 25a of the lead 25 with a bonding-wire 63 via the metallic pattern on the sub-mount 27. The maximum levels of two bonding-wires 61 and 63 are preferably smaller than the level of the laser diode 5.

Figure 13:
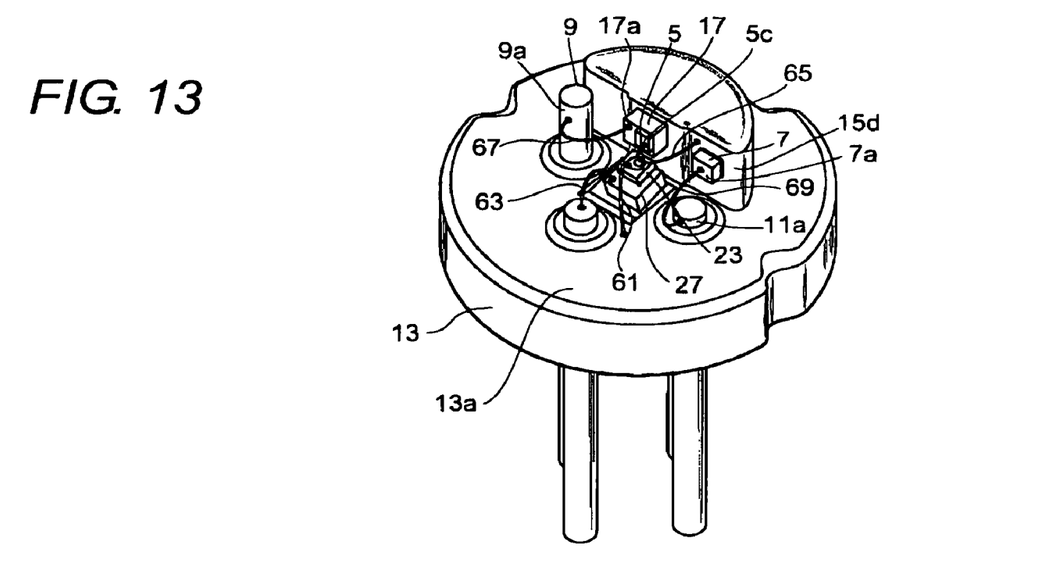
FIG. 13 shows a second wire-bonding step carried out subsequent to FIG. 12.

Subsequently to the first wire-bonding process, the second wire-bonding process is carried out as shown in FIG. 13. The laser diode 5 and the T-sensor 9 are wire-bonded to respective leads 9 and 11. A metallic pattern provided on the heat sink 17, which is connected to the one electrode of the laser diode 5, is connected to the side of the lead 9 with a bonding-wire 67, while the terminal of the T-sensor 7 is connected to the lead 23 with a wire 69. Another electrode 5c of the laser diode 5 is wire-bonded to the block 15d with a bonding-wire 65.

The bonding-wire 65 and the other bonding-wire 67 extend to opposite with respect to the laser diode 5, i.e., the wire 65 extends from the laser diode 5 to the side 15d of the block 15, while the wire 67 extends to the side 9a of the lead 9. Another bonding-wire 69 extends from the T-sensor 7 to the side 11a of the lead 11, which is perpendicular to the extending direction of the wires 65 and 67.

After completing the first and second wire-bonding processes, the cap 41 is placed on the base 13 and forms a cavity together with the base 13. The cavity, into which the laser diode 5, the T-sensor 7 and the photodiode 23 is enclosed, is air-tightly sealed by the resistance welding of the cap 41 to the base 13. The cap may provide the lens 53 in a top center portion thereof. The light emitted from the laser diode 5 enters the coupling fiber in the stub through the lens 53.

(Eighth Embodiment)

Figure 14:
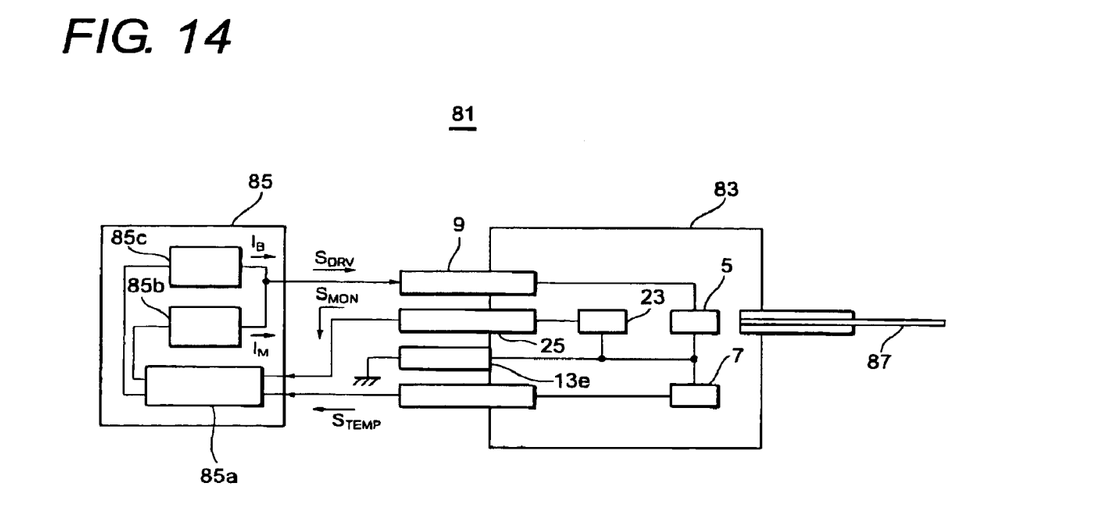
FIG. 14 is a circuit diagram of an optical transmission apparatus including the optical transmitting module of the first embodiment of the invention.

FIG. 14 shows a circuit diagram of an optical transmission apparatus 81. The optical transmission apparatus 81 provides the optical transmitting module 83, which may be one of optical transmitting modules previously described, and a driving circuit 85. The driving circuit, responding to the sensed signal $S_{TEMP}$ output form the optical module, generates the bias current $I_B$ and the modulation current $I_M$. More specifically, the control block 85a in the driving circuit 85 generates control signals for the modulation current block 85b and the bias current block 85c by responding the sensed signal $S_{TEMP}$, which corresponds to the temperature of the laser diode 5, and the signal $S_{MON}$, which corresponds to the optical output power of the laser diode 5. Both current blocks 85b and 85c, by responding to control signals inputted thereto, respectively generate adjusted modulation current $I_M$ and adjusted bias current $I_B$. The laser diode 5 emits light by receiving these adjusted modulation and adjusted bias currents through the lead 9.

Thus, even in the optical apparatus 83 without the thermoelectric device for controlling the temperature of the laser diode, an optical output compensated for the temperature of the laser diode can be obtained, because the T-sensor built in the module can trace the temperature of the laser diode and the driving circuit can provide the adjusted modulation and bias currents thereto.

Because of its compactness of the CAN type package, it is not easy to build the T-sensor within the package. The CAN type package restricts not only the size of the cavity, in which the optical and electrical devices are enclosed, but also the number of leads. Moreover, the laser diode must be placed on the side of the block to direct point the optical axis thereof at the top of the package, which means that bonding-wires connecting respective devices and elements in the package become complicated. Therefore, an elegant arrangement of devices and elements in the CAN type package is provided in the present invention.

While the invention has been particularly shown and described with respect to illustrative and preferable embodiments thereof, it will be understood by those skilled in the art that the foregoing and other changes in arrangement and details may be made therein without departing from the spirit and scope of the invention. For example, a thermistor is described in exemplary as the T-sensor in the forgoing specification. However, another device, such as a platinum resistance thermometer or a junction diode, may be applicable to the present invention. Therefore, it is intended that the specification and examples be considered exemplary only, the true scope and spirit of the present invention being indicated by the following claims.

What is claimed is:

1. An optical transmitting module, comprising:
    a semiconductor laser diode for emitting light by receiving a bias current and a driving signal;
    an inductor for supplying said bias current therethrough;
    a driver for supplying said driving signal to said laser diode;
    a temperature sensor; and
    a CAN type package for enclosing said laser diode, said inductor, said driver and said temperature sensor therein, said CAN type package including a base, and a block provided on said base and having a side surface for mounting said laser diode and said driver thereon, said base providing a plurality of leads, one of said leads having a flat side surface on a top end portion thereof to mount said inductor therein,
    wherein said temperature sensor senses a temperature within said package and said driver receives said driving signal through the other of said leads and said bias current through said one of said leads via said inductor and supplies a superimposed signal of said driving signal on said bias current to said laser diode.

2. The optical transmitting module according to claim 1, wherein said temperature sensor is mounted on another side surface of said block different from said side surface on which said laser diode is mounted.

3. The optical transmitting module according to claim 1, wherein said temperature sensor is mounted on a top surface of said block.

4. The optical transmitting module according to claim 1, wherein said temperature sensor is mounted on said base.

5. The optical transmitting module according to claim 1, wherein said base further provides a third lead different from said one of said lead that mounts said inductor and the other of said leads that provides said driving signal to said driver, said temperature sensor being mounted on a top of said third lead.

6. The optical transmitting module according to claim 5, wherein said third lead includes a flat side surface on a top end portion thereof, said temperature sensor being mounted on said flat side surface of said first lead.

7. The optical transmitting module according to claim 1, wherein said driver is an integrated circuit including a driving circuit for driving said laser diode and a temperature sensor for sensing a temperature of said integrated circuit.

8. A transmitting optical sub-assembly, comprising:
    an optical transmitting module, including:
        a semiconductor laser diode for emitting light receiving a bias current and a driving signal,
        a driver for supplying said driving signal to said laser diode,
        a temperature sensor, and
        a CAN type package for enclosing said laser diode, said inductor, said driver and said temperature sensor therein, said CAN tare package including a base, a block, and a cap for forming a cavity co-operating with said base, said laser diode, said driver, said inductor and said temperature sensor being enclosed within said cavity, said block being provided on said base and having a side surface for mounting said laser diode and said driver thereon, said base providing a plurality of leads, one of said leads having a flat side surface on a top end portion thereof to mount said inductor,
    wherein said temperature sensor senses a temperature within said package and said driver receives said driving signal through the other of said leads and said bias current through said one of said leads via said inductor and supplies a superimposed signal of said driving signal on said bias current to said laser diode;

a welding member cylindrically surrounding said cap provided in said CAN type package;

an alignment member having a bore and an end surface, said welding member being inserted into said bore of said alignment member and being fixed to said alignment member; and a sleeve assembly, including:

a stub having a coupling fiber disposed in a center thereof, said light emitted from said laser diode being converged to said coupling fiber, a sleeve for securing said stub to an end portion thereof, a sleeve cover for covering said sleeve, said sleeve cover having an end surface, and a bush press-fitted between said sleeve cover and said end portion of said sleeve such that said stub is tightly positioned within said sleeve, wherein said sleeve assembly is optically aligned to said laser diode installed in said CAN type package by sliding said end surface of said sleeve cover on said end surface of said alignment member, and by sliding said welding member within said bore of said alignment member.

9. The transmitting optical sub-assembly according to claim 8, wherein said temperature sensor is mounted on another side surface of said block different from said side surface on which said laser diode is mounted.

* * * * *